United States Patent [19]
Takeuchi et al.

[11] Patent Number: 5,814,920
[45] Date of Patent: Sep. 29, 1998

[54] PIEZOELECTRIC/ELECTROSTRICTIVE FILM-TYPE ELEMENT AND METHOD FOR PRODUCING THE SAME

[75] Inventors: Yukihisa Takeuchi, Nishikamo-gun; Tsutomu Nanataki, Toyoake; Koji Kimura, Nagoya; Nobuo Takahashi, Owariasahi, all of Japan

[73] Assignee: NGK Insulators Ltd., Japan

[21] Appl. No.: 777,953

[22] Filed: Dec. 23, 1996

[30] Foreign Application Priority Data

Dec. 28, 1995 [JP] Japan ................................ 7-342414

[51] Int. Cl.⁶ .................................................. H01L 41/08
[52] U.S. Cl. ........................ 310/330; 310/328; 310/324
[58] Field of Search .................................. 310/324, 328, 310/330–332, 357–359, 365, 366

[56] References Cited

U.S. PATENT DOCUMENTS

| | | | |
|---|---|---|---|
| 5,089,455 | 2/1992 | Ketcham et al. | 501/104 |
| 5,210,455 | 5/1993 | Takeuchi et al. | 310/328 |
| 5,376,857 | 12/1994 | Takeuchi et al. | 310/328 |

FOREIGN PATENT DOCUMENTS

| | | |
|---|---|---|
| 3-128681 | 5/1931 | Japan . |
| 5-49270 | 2/1991 | Japan . |
| 5-270912 | 10/1993 | Japan . |
| 6-260694 | 9/1994 | Japan . |
| 2 161 647 | 7/1984 | United Kingdom . |

*Primary Examiner*—Mark O. Budd
*Attorney, Agent, or Firm*—Parkhurst & Wendel

[57] ABSTRACT

A piezoelectric and/or electrostrictive film-type element comprises a zirconia substrate with a thin-walled diaphragm section provided integrally to cover and close a window to serve as a hollow space, and a film-shaped piezoelectric and/or electrostrictive operating section composed of a lower electrode, a piezoelectric and/or electrostrictive layer, and an upper electrode which are successively provided in a layered configuration on an outer surface of the diaphragm section in accordance with a film-forming method, wherein at least a part of a peripheral edge portion of the piezoelectric and/or electrostrictive layer extends laterally beyond a corresponding peripheral edge portion of the lower electrode to construct an overhang section located opposingly over the diaphragm section, and the overhang section is in a state of incomplete connection with respect to a partial region of the diaphragm section located just under by the aid of particles of an alumina-magnesia compound such as spinel particles allowed to intervene therebetween. Thus, it is possible to effectively improve, for example, the piezoelectric and/or electrostrictive characteristics such as the displacement amount, and the resonance frequency characteristics.

6 Claims, 4 Drawing Sheets

PIEZOELECTRIC/ELECTROSTRICTIVE FILM-TYPE ELEMENT AND METHOD FOR PRODUCING THE SAME

BACKGROUND OF THE INVENTION

1. Field of the Invention

The present invention relates to a piezoelectric and/or electrostrictive film-type element. In particular, the present invention relates to a piezoelectric and/or electrostrictive film-type element such as those of the uni-morph type or the bi-morph type for generating or detecting bending displacement or force, to be principally used, for example, for actuators, filters, displays, transformers, microphones, sounding bodies (such as speakers), various vibrators, resonators, oscillators, discriminators, gyroscopes, and sensors. The present invention also relates to a method for producing such a piezoelectric and/or electrostrictive film-type element. The element referred to herein is intended to include elements which convert electric energy into mechanical energy, i.e., mechanical displacement, force, strain, or vibration, as well as elements which perform conversion reversely from the latter to the former.

2. Description of the Related Art

Recently, it has been demanded, in the fields of optics, precision manufacturing, etc., to use a displacement element for adjusting the optical path length or the position on the order of submicron, and a detecting element for detecting minute displacement after converting it into an electric variation. In order to respond to such a demand, there have been developed piezoelectric and/or electrostrictive elements to be used for actuators and sensors, which function as an element to utilize occurrence of displacement based on the reverse or converse piezoelectric effect caused when an electric field is applied to a piezoelectric material such as a ferroelectric substance, or which function as an element to utilize a phenomenon reverse to the foregoing. Among them, as for speakers, for example, those preferably adopted as such a piezoelectric and/or electrostrictive element structure include, for example, those of the uni-morph type which have been hitherto known.

In such a state of art, the present applicant has been also previously proposed piezoelectric and/or electrostrictive film-type elements made of ceramics, which can be preferably used for various applications, as described, for example, in Japanese Laid-Open Patent Publication Nos. 3-128681 and 5-49270. The previously proposed piezoelectric and/or electrostrictive film-type elements have the following structure. Namely, the element comprises a ceramic substrate having at least one window (hollow space) and including a thin-walled diaphragm section provided integrally to cover and close the window so that at least one thin-walled wall section is formed. The element further includes, on an outer surface of the diaphragm section of the ceramic substrate, a piezoelectric and/or electrostrictive operating section comprising a combination of a lower electrode, a piezoelectric and/or electrostrictive layer, and an upper electrode, in which the piezoelectric and/or electrostrictive operating section is integrally stacked and formed in accordance with a film-forming method. The element has such excellent features that it serves as a compact and inexpensive electromechanical conversion element with high reliability to provide a large displacement at a low driving voltage, in which the response speed is quick, and the generated force is large. It is acknowledged that such a piezoelectric and/or electrostrictive film-type element is extremely useful to be used, for example, as a constituting component of actuators, filters, displays, and sensors.

The present inventors have made further investigation on such a piezoelectric and/or electrostrictive film-type element. As a result, the following facts have been clarified. Namely, the piezoelectric and/or electrostrictive film-type element as described above is constructed such that a lower electrode, a piezoelectric and/or electrostrictive layer, and an upper electrode, which construct a piezoelectric and/or electrostrictive operating section, are successively stacked and formed in a layered configuration in accordance with the film-forming method at a predetermined position on a diaphragm section of a fired ceramic substrate, to which a necessary heat treatment (firing) is applied to provide a structure in which the piezoelectric and/or electrostrictive operating section is integrally formed on the diaphragm section. However, the piezoelectric and/or electrostrictive characteristics of the piezoelectric and/or electrostrictive film-type element obtained as described above are considerably degraded depending on the heat treatment (firing) upon the formation of the piezoelectric and/or electrostrictive operating section, specifically the piezoelectric and/or electrostrictive layer.

Namely, when the piezoelectric and/or electrostrictive film-type element as described above is produced, a structure is actually adopted, in which the piezoelectric and/or electrostrictive layer is formed to be slightly larger than the lower electrode so that the lower electrode is covered therewith, in order to avoid a short circuit which would be otherwise formed by the upper electrode formed on the upper surface of the piezoelectric and/or electrostrictive layer and the lower electrode formed on the lower surface of the piezoelectric and/or electrostrictive layer, and well maintain insulation between the upper and lower electrodes. Accordingly, peripheral edge portions of the piezoelectric and/or electrostrictive layer, which extend laterally beyond peripheral edge portions of the lower electrode, are apt to firmly fuse or conglutinate (join) with portions of the diaphragm section of the ceramic substrate located just under the peripheral edge portions, because the peripheral edge portions of the piezoelectric and/or electrostrictive layer are composed of a piezoelectric and/or electrostrictive material which generally contains a Pb component or the like, having high reactivity with other materials. Therefore, such fused or conglutinated portions (joined portions) serve to increase the residual stress on the piezoelectric and/or electrostrictive layer. As a result, the piezoelectric and/or electrostrictive characteristics of the obtained piezoelectric and/or electrostrictive film-type element are degraded.

Further, the following problem has been inherently involved. Namely, the presence or absence of junction, or the dispersion in degree of junction between the peripheral edge portions of the piezoelectric and/or electrostrictive layer extending laterally beyond the lower electrode and the portions of the diaphragm section located just thereunder evokes, for example, dispersion in sintering of the piezoelectric and/or electrostrictive layer, dispersion in the residual stress, and dispersion in rigidity of the element, among respective piezoelectric and/or electrostrictive film-type elements obtained by production, or among a plurality of piezoelectric and/or electrostrictive operating sections included in one piezoelectric and/or electrostrictive film-type element, resulting in, for example, large dispersion in piezoelectric and/or electrostrictive characteristics such as the amount of displacement, and large dispersion in resonance frequency characteristics.

In such a situation, Japanese Laid-Open Patent Publication No. 6-260694 discloses a piezoelectric and/or electrostrictive film-type element having a structure in which a piezoelectric and/or electrostrictive film on a lower electrode is allowed to have a size sufficient to cover the lower electrode, with its end portions protruding to positions over a ceramic substrate, so that the protruding portions are in an incomplete connection state with respect to the ceramic substrate. However, in this patent document, the incomplete connection state is intended to be realized by using the ceramic substrate having low reactivity with respect to the piezoelectric and/or electrostrictive film, or by forming a dummy layer comprising a resin material or the like between them. Therefore, this technique involves difficult problems concerning production steps, including, for example, necessity to precisely control conditions for firing the piezoelectric and/or electrostrictive film, such as the firing temperature and the firing atmosphere. Moreover, a problem still remains in reproducibility to repeat the production steps even if adjustment is performed as described above.

SUMMARY OF THE INVENTION

Accordingly, the present invention has been made with the background of the foregoing situation, an object of which is to provide a method for producing a piezoelectric and/or electrostrictive film-type element comprising a piezoelectric and/or electrostrictive operating section formed in accordance with a film-forming method on an outer surface of a ceramic substrate comprising a zirconia material as described above, that is, in other words, a diaphragm section for constructing a thin-walled wall section of a zirconia substrate, wherein a fully novel technique is used to avoid junction upon firing between the diaphragm section and an overhang section which is a laterally extending section of a piezoelectric and/or electrostrictive layer so that the piezoelectric and/or electrostrictive characteristics and the resonance frequency characteristics of the element are improved to be uniform, making it possible to advantageously obtain the element with improved displacement characteristics. Another object of the present invention is to provide the piezoelectric and/or electrostrictive film-type element obtained in accordance with the method of the present invention.

In order to achieve the object as described above, the piezoelectric and/or electrostrictive film-type element according to the present invention lies in a piezoelectric and/or electrostrictive film-type element having at least one hollow space and comprising a zirconia substrate with a thin-walled diaphragm section provided integrally to cover and close the hollow space, and a film-shaped piezoelectric and/or electrostrictive operating section composed of a lower electrode, a piezoelectric and/or electrostrictive layer, and an upper electrode which are successively provided in a layered configuration on an outer surface of the diaphragm section in accordance with a film-forming method, wherein at least a part of a peripheral edge portion of the piezoelectric and/or electrostrictive layer extends laterally beyond a corresponding peripheral edge portion of the lower electrode to construct an overhang section located opposingly over the diaphragm section, and the overhang section is in an incomplete connection state with respect to a partial region of the diaphragm section located just thereunder by the aid of particles principally comprising a compound of alumina and magnesia allowed to intervene between the overhang section and the partial region of the diaphragm section located just thereunder.

In the present invention thus constructed, at least the part of the peripheral edge portion of the piezoelectric and/or electrostrictive layer extends laterally beyond the corresponding peripheral edge portion of the lower electrode to form the overhang section under which the lower electrode does not exist. However, the overhang section is in the incomplete connection state with respect to the partial region of the diaphragm section located just thereunder. Accordingly, the problem of residual stress, which would be otherwise evoked by junction between the overhang section and the partial region of the diaphragm section, is effectively dissolved. Further, the present invention avoids bad influences which would be otherwise exerted on the piezoelectric and/or electrostrictive characteristics resulting from junction between the overhang section and the partial region of the diaphragm section, so that, for example, the displacement characteristics may be effectively improved. The incomplete connection state between the overhang section and the partial region of the diaphragm section is more effectively realized by the intervention of the particles principally comprising the compound of alumina and magnesia, such as spinel.

It is noted that the incomplete connection state referred to herein is designated as follows. Namely, the overhang section of the piezoelectric and/or electrostrictive layer is incompletely connected to the diaphragm section or the layer of the particles principally comprising the compound of alumina and magnesia located just thereunder, providing a state of connection of a degree in which the object of the present invention can be sufficiently achieved. More specifically, the state resides in a peel (peel off) strength which is not more than $0.25$ $kg/mm^2$, preferably not more than $0.025$ $kg/mm^2$, more preferably not more than $0.0125$ $kg/mm^2$ between the overhang section of the piezoelectric and/or electrostrictive layer and the diaphragm section or the layer of the particles principally comprising the compound of alumina and magnesia located just thereunder.

The piezoelectric and/or electrostrictive film-type element according to the present invention as described above may be produced in accordance with any one of the following four techniques A, B, C and D.

Method A

A method for producing a piezoelectric and/or electrostrictive film-type element having at least one hollow space and comprising a zirconia substrate with a thin-walled diaphragm section provided integrally to cover and close the hollow space, and a film-shaped piezoelectric and/or electrostrictive operating section composed of a lower electrode, a piezoelectric and/or electrostrictive layer, and an upper electrode which are successively provided in a layered configuration on an outer surface of the diaphragm section in accordance with a film-forming method, the method for producing the piezoelectric and/or electrostrictive film-type element comprising the steps of preparing the zirconia substrate having been fired in which at least the diaphragm section contains alumina, forming the lower electrode on the outer surface of the diaphragm section of the zirconia substrate, subsequently forming the piezoelectric and/or electrostrictive layer on the lower electrode in accordance with a film-forming method by using a piezoelectric and/or electrostrictive material containing magnesia or a component to give magnesia independently or in a form of a compound so that at least a part of a peripheral edge portion of the piezoelectric and/or electrostrictive layer extends laterally beyond a corresponding peripheral edge portion of the lower electrode to construct an overhang section located opposingly over the diaphragm section, and firing the piezoelectric and/or electrostrictive layer so that particles principally comprising a compound of alumina and magnesia are allowed to deposit at least at a boundary between the overhang section and a partial region of the diaphragm section located just thereunder, and thus an incomplete connection state is established between the overhang section and the partial region of the diaphragm section located just thereunder.

Method B

A method for producing a piezoelectric and/or electrostrictive film-type element having at least one hollow space and comprising a zirconia substrate with a thin-walled diaphragm section provided integrally to cover and close the hollow space, and a film-shaped piezoelectric and/or electrostrictive operating section composed of a lower electrode, a piezoelectric and/or electrostrictive layer, and an upper electrode which are successively provided in a layered configuration on an outer surface of the diaphragm section in accordance with a film-forming method, the method for producing the piezoelectric and/or electrostrictive film-type element comprising the steps of preparing the zirconia substrate having been fired, forming the lower electrode on the outer surface of the diaphragm section of the zirconia substrate in accordance with a film-forming method by using an electrode material containing alumina or a component to give alumina, subsequently forming the piezoelectric and/or electrostrictive layer on the lower electrode in accordance with a film-forming method by using a piezoelectric and/or electrostrictive material containing magnesia or a component to give magnesia independently or in a form of a compound so that at least a part of a peripheral edge portion of the piezoelectric and/or electrostrictive layer extends laterally beyond a corresponding peripheral edge portion of the lower electrode to construct an overhang section located opposingly over the diaphragm section, and firing the piezoelectric and/or electrostrictive layer so that particles principally comprising a compound of alumina and magnesia are allowed to deposit at least at a boundary between the overhang section and a partial region of the diaphragm section located just thereunder, and thus an incomplete connection state is established between the overhang section and the partial region of the diaphragm section located just thereunder.

Method C

A method for producing a piezoelectric and/or electrostrictive film-type element having at least one hollow space and comprising a zirconia substrate with a thin-walled diaphragm section provided integrally to cover and close the hollow space, and a film-shaped piezoelectric and/or electrostrictive operating section composed of a lower electrode, a piezoelectric and/or electrostrictive layer, and an upper electrode which are successively provided in a layered configuration on an outer surface of the diaphragm section in accordance with a film-forming method, the method for producing the piezoelectric and/or electrostrictive film-type element comprising the steps of preparing the zirconia substrate having been fired, forming a separation layer containing alumina or a component to give alumina at least around a region on which the lower electrode is formed, on the outer surface of the diaphragm section of the zirconia substrate, forming the lower electrode on the outer surface of the diaphragm section before or after the formation of the separation layer, subsequently forming the piezoelectric and/or electrostrictive layer on the lower electrode in accordance with a film-forming method by using a piezoelectric and/or electrostrictive material containing magnesia or a component to give magnesia independently or in a form of a compound so that at least a part of a peripheral edge portion of the piezoelectric and/or electrostrictive layer extends laterally beyond a corresponding peripheral edge portion of the lower electrode to construct an overhang section located opposingly over the diaphragm section, and firing the piezoelectric and/or electrostrictive layer so that particles principally comprising a compound of alumina and magnesia are allowed to deposit at least at a boundary between the overhang section and a partial region of the diaphragm section located just thereunder, and thus an incomplete connection state is established between the overhang section and the partial region of the diaphragm section located just thereunder.

Method D

A method for producing a piezoelectric and/or electrostrictive film-type element having at least one hollow space and comprising a zirconia substrate with a thin-walled diaphragm section provided integrally to cover and close the hollow space, and a film-shaped piezoelectric and/or electrostrictive operating section composed of a lower electrode, a piezoelectric and/or electrostrictive layer, and an upper electrode which are successively provided in a layered configuration on an outer surface of the diaphragm section in accordance with a film-forming method, the method for producing the piezoelectric and/or electrostrictive film-type element comprising the steps of preparing the zirconia substrate having been fired, forming a separation layer containing alumina or a component to give alumina and magnesia or a component to give magnesia, or containing particles principally comprising a compound of alumina and magnesia, at least around a region on which the lower electrode is formed, on the outer surface of the diaphragm section of the zirconia substrate, forming the lower electrode on the outer surface of the diaphragm section before or after the formation of the separation layer, subsequently forming the piezoelectric and/or electrostrictive layer on the lower electrode in accordance with a film-forming method so that at least a part of a peripheral edge portion of the piezoelectric and/or electrostrictive layer extends laterally beyond a corresponding peripheral edge portion of the lower electrode to construct an overhang section located opposingly over the diaphragm section, and firing the piezoelectric and/or electrostrictive layer so that particles principally comprising a compound of alumina and magnesia are allowed to deposit or intervene at least at a boundary between the overhang section and a partial region of the diaphragm section located just thereunder, and thus an incomplete connection state is established between the overhang section and the partial region of the diaphragm section located just thereunder.

According to the methods for producing the piezoelectric and/or electrostrictive film-type element in accordance with the present invention as described above, the alumina component and the magnesia component migrate up to the boundary between the overhang section of the piezoelectric and/or electrostrictive layer and the partial region of the diaphragm section which is located just thereunder and on which the lower electrode does not exist. The alumina and magnesia components make reaction at the boundary to deposit the particles principally comprising the compound of alumina and magnesia, such as spinel. The deposition or the existence of the particles of the compound such as spinel at the boundary as described above makes it possible to effectively avoid firm conglutination or junction which would be otherwise formed between the overhang section of the piezoelectric and/or electrostrictive layer and the partial region of the diaphragm section located just thereunder.

Thus the incomplete connection state is realized, thereby advantageously decreasing the residual stress on the piezoelectric and/or electrostrictive layer. Accordingly, the piezoelectric and/or electrostrictive characteristics can be advantageously improved, and the dispersion in the piezoelectric and/or electrostrictive characteristics can be effectively reduced.

The particles deposited in accordance with the four methods for producing the piezoelectric and/or electrostrictive film-type element described above are advantageously spinel ($MgAl_2O_4$) particles. Those which contain magnesia as a part of a composition to exhibit the piezoelectric and/or electrostrictive characteristics are advantageously used for the piezoelectric and/or electrostrictive material.

In the foregoing method D, when the piezoelectric and/or electrostrictive layer is formed, it is also allowable to use a piezoelectric and/or electrostrictive material containing magnesia or a component to give magnesia independently or in a form of a compound. This procedure is advantageous when the composition of the separation layer is alumina-rich, or for facilitating the reaction of alumina and magnesia contained in the separation layer.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
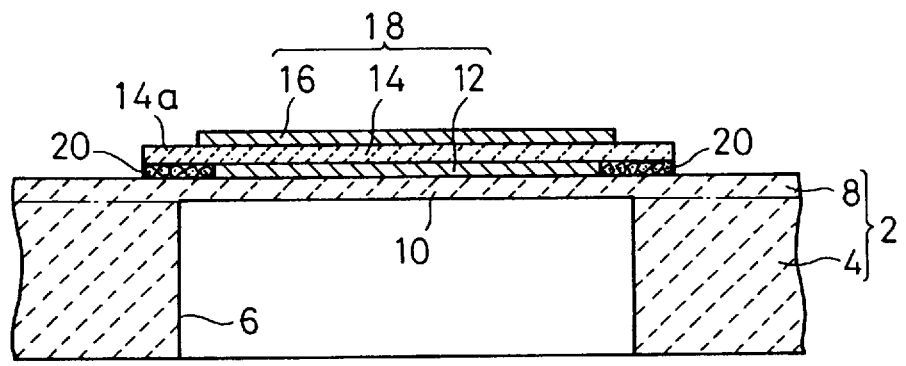
FIG. 1 explanatorily shows a partial cross-sectional view illustrating an example of a basic structure of a piezoelectric and/or electrostrictive film-type element according to the present invention.

The present invention lies in the piezoelectric and/or electrostrictive film-type element having the structure including the film-shaped piezoelectric and/or electrostrictive operating section provided in accordance with the film-forming method on the outer surface of the partial region of the diaphragm section formed integrally to cover and close the hollow space provided through the zirconia substrate as described above, wherein the piezoelectric and/or or electrostrictive layer, which constructs the piezoelectric and/or electrostrictive operating section, forms the overhang section with respect to the lower electrode. Thus the upper electrode can be easily formed without considering any short circuit which would be otherwise formed with respect to the lower electrode. Further, the particles principally comprising the compound of alumina and magnesia are allowed to intervene between the overhang section of the piezoelectric and/or electrostrictive layer under which the lower electrode does not exist, and the partial region of the diaphragm section located just thereunder so that the incomplete connection state is established therebetween. Thus it is intended to achieve the objects described above. In this context, an example of a basic structure of such a piezoelectric and/or electrostrictive film-type element, which is the objective of the present invention, is shown in FIG. 1. The embodiment shown in FIG. 1 demonstrates a structure concerning one window.

Namely, in FIG. 1, a zirconia substrate 2 comprises a base plate 4 having a predetermined thickness to serve as a support and including a rectangular window 6 having a predetermined size to serve as a hollow space, and a thin-walled diaphragm plate 8 overlapped on one surface of the base plate 4 to cover and close the window 6, wherein the base plate 4 and the diaphragm plate 8 are combined into a single unit. A portion of the diaphragm plate 8, which is located on the window 6 of the base plate 4, is used as a diaphragm section 10. A film-shaped lower electrode 12, a piezoelectric and/or electrostrictive layer 14, and an upper electrode 16 are successively stacked and formed respectively in accordance with an ordinary film-forming method on an outer surface of the diaphragm section 10 of the plate-shaped zirconia substrate 2 to integrally form a film-shaped piezoelectric and/or electrostrictive operating section 18.

Therefore, when the piezoelectric and/or electrostrictive film-type element having the structure as described above is operated as an actuator, a voltage is applied, through respective unillustrated lead sections, between the two electrodes 12, 16 which construct the piezoelectric and/or electrostrictive operating section 18. Thus an electric power is applied in the same manner as hitherto performed. In accordance therewith, an electric field is allowed to act on the piezoelectric and/or electrostrictive layer 14, and thus an electric field-induced strain based thereon is evoked. A bending displacement or a force appears in a direction perpendicular to the plate surface of the zirconia substrate 2 (diaphragm section 10) owing to the transverse effect of the electric field-induced strain.

Figure 2:
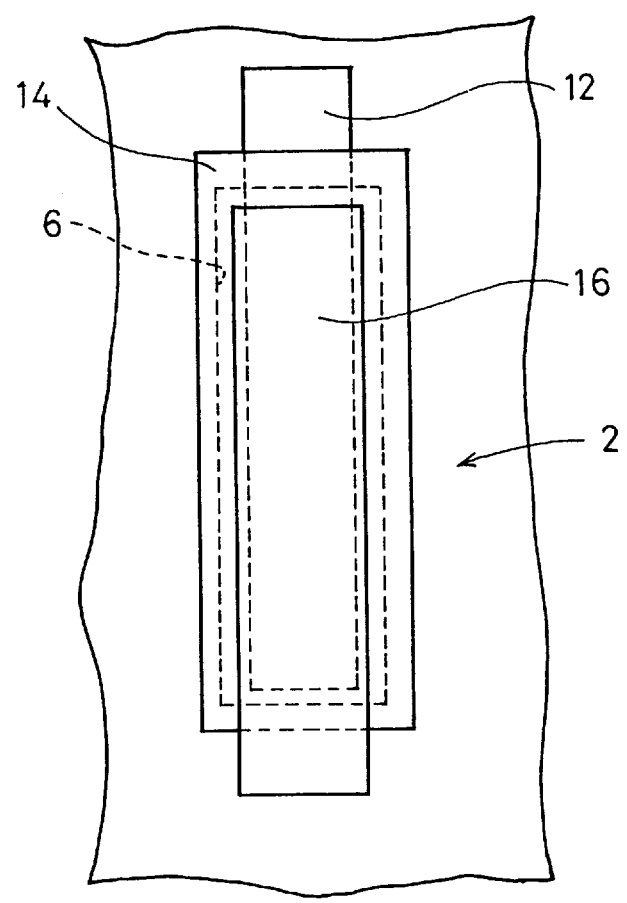
FIG. 2 explanatorily shows a plan view illustrating a form of arrangement of respective layers of a piezoelectric and/or electrostrictive operating section of the piezoelectric and/or electrostrictive film-type element shown in FIG. 1.

In the present invention, as shown in FIG. 1, the piezoelectric and/or electrostrictive film-type element is constructed such that peripheral edge portions of the piezoelectric and/or electrostrictive layer 14 which constructs the piezoelectric and/or electrostrictive operating section 18 extend laterally beyond corresponding peripheral edge portions of the lower electrode 12 to form overhang sections 14a located opposingly on partial regions of the diaphragm section 10 on which the lower electrode 12 does not exist. Junction-prohibiting particles 20, which principally comprise a compound of alumina and magnesia, are allowed to intervene between the overhang sections 14a and the partial regions of the diaphragm section 10 located just thereunder. Thus an incomplete connection state is established therebetween. A planar form of arrangement of the lower electrode 12, the piezoelectric and/or electrostrictive layer 14, and the upper electrode 16 which construct the piezoelectric and/or electrostrictive operating section 18 is shown in FIG. 2. As clarified from FIG. 2, the piezoelectric and/or electrostrictive layer 14 is formed to cover the lower electrode 12 substantially entirely while leaving the lead section thereof for external connection. Thus the configuration is formed such that at least parts of the peripheral edge portions of the piezoelectric and/or electrostrictive layer 14 extend laterally beyond the corresponding peripheral edge portions of the lower electrode 12. The upper electrode 16 is formed on the piezoelectric and/or electrostrictive layer 14 so that the upper electrode 16 is superimposed over the lower electrode 12. One end of the upper electrode 16, which protrudes beyond the piezoelectric and/or electrostrictive layer 14, is used as the lead section for external connection.

Therefore, according to the structure of the piezoelectric and/or electrostrictive operating section 18 of the piezoelectric and/or electrostrictive film-type element thus constructed, the overhang sections 14a are formed by the extending peripheral edge portions of the piezoelectric and/or electrostrictive layer 14, and the upper electrode 16 is formed on the piezoelectric and/or electrostrictive layer 14 in a state in which the lower electrode 12 is covered with the overhang sections 14a. Accordingly, it is a matter of course that the fear of short circuit formation between the upper electrode 16 and lower electrode 12 is completely dissolved, and the upper electrode 16 can be easily formed while effectively maintaining insulation between the two electrodes 12, 16. Moreover, the overhang sections 14a are not fused, not conglutinated (not joined), and not firmly connected to the partial regions of the diaphragm section 10 located just thereunder. Accordingly, when the piezoelectric and/or electrostrictive operating section 18 is operated, its operating characteristics are scarcely badly affected. Thus it is possible to effectively improve, for example, the piezoelectric and/or electrostrictive characteristics such as the displacement amount, and the resonance frequency characteristics.

The piezoelectric and/or electrostrictive film-type element, which is the objective of the present invention as described above, has the piezoelectric and/or electrostrictive operating section 18 formed on the zirconia substrate 2 which is produced from a material to be appropriately selected, including various known stabilized zirconia materials and partially stabilized zirconia materials. Among such materials, those preferably used include a material comprising a major component of zirconia partially stabilized by adding a compound such as yttria to provide a crystal phase which is principally based on tetragonal crystal, or provide mixed crystal principally comprising two or more crystal phases selected from cubic, tetragonal, and monoclinic crystals, as disclosed by the present inventors in Japanese Laid-Open Patent Publication No. 5-270912. The crystal grain size (average particle diameter) of the zirconia substrate 2 as described above is preferably not more than 1 $\mu$m. The zirconia substrate 2, which is produced from the foregoing material, exhibits large mechanical strength and high toughness even in the case of a thin thickness of the plate. Moreover such a zirconia substrate 2 exhibits a feature that the chemical reaction with the piezoelectric and/or electrostrictive material scarcely occurs.

In the present invention, the firm junction is effectively suppressed or dissolved between the partial regions of the diaphragm section 10 of the zirconia substrate 2 comprising the zirconia material as described above and the overhang sections 14a of the piezoelectric and/or electrostrictive layer 14 located thereover without interposing the lower electrode 12 so that the incomplete connection state is established. For this purpose, it is desirable to allow the junction-prohibiting particles 20 principally comprising the compound of alumina and magnesia, especially spinel ($MgAl_2O_4$) particles to deposit and intervene between the overhang sections 14a and the partial regions of the diaphragm section 10 located just thereunder. Owing to the low reactivity of such compound particles 20 with respect to the piezoelectric and/or electrostrictive layer 14, it is possible to effectively mitigate or avoid the junction which would be otherwise formed between the overhang sections 14a and the partial regions of the diaphragm section 10.

The four techniques A, B, C and D described above are advantageously adopted in order to produce the piezoelectric and/or electrostrictive film-type element having the structure in which the firm junction between the overhang sections 14a and the partial regions of the diaphragm section 10 is prohibited by the intervention of the junction-prohibiting particles 20 principally comprising the compound of alumina and magnesia, such as spinel particles, and thus the incomplete connection state is established therebetween. Among them, according to the method A, at first, the zirconia substrate 2 comprising the zirconia material is prepared, in which a predetermined amount of alumina is contained in at least the diaphragm section 10. Alumina is effectively contained in other regions of the zirconia substrate 2, for example, in the regions of the base plate 4, in addition to the diaphragm section 10. However, if the content of alumina is too much, for example, problems of cracks and defects arise in the diaphragm section 10. Therefore, it is desirable that the content of alumina is generally not more than 5.0% by weight, preferably not more than 2.5% by weight. On the other hand, if the content of alumina is too less, it is impossible to expect the deposition and intervention of the particles in an amount sufficient to prohibit the junction. Accordingly, it is desirable that alumina is contained generally in a ratio of not less than 0.1% by weight, preferably not less than 1.1% by weight.

The zirconia substrate 2, in which a predetermined amount of alumina is contained in at least the diaphragm section 10, is obtained as follows. Namely, the predetermined amount of alumina or a component to give alumina is contained in at least a portion of a green sheet to produce the zirconia substrate 2 on which the diaphragm section 10 is formed, in accordance with a known method, followed by firing. However, in view of high reliability, the following procedure is especially preferred. Namely, a zirconia green sheet to form the base plate 4 is prepared, in which a hollow space to serve as the window 6 is provided by adopting a machine processing technique such as processing with a mold or ultrasonic. A thin zirconia green sheet containing a predetermined amount of alumina, which is used to form the diaphragm plate 8 (diaphragm section 10), is stacked on the prepared zirconia green sheet, and allowed to thermally adhere under a pressure, followed by firing to combine the sheets into single unit. It is desirable that the diaphragm section 10 of the zirconia substrate 2, on which the piezoelectric and/or electrostrictive operating section 18 is formed, generally has a thickness (after the firing) of not more than 50 $\mu$m, preferably not less than 1 $\mu$m and not more than 30 $\mu$m, more preferably about 3 to 15 $\mu$m, in order to obtain high-speed response performance and large displacement of the element.

The respective zirconia green sheets, which comprise predetermined zirconia materials for producing the base plate 4 and the diaphragm plate 8 as described above, may be formed by lamination of a plurality of sheet components respectively. As for the shape of the diaphragm section 10 of the zirconia substrate 2, it is possible to adopt, in addition to the flat shape as shown in the drawings, an outwardly convex shape formed opposingly to the side of the window 6, and an inwardly concave shape recessed into the window 6. However, the effect of the present invention is more effectively achieved by using a zirconia substrate 2 with a diaphragm section 10 having an outwardly convex shape, and forming a piezoelectric and/or electrostrictive layer on the zirconia substrate, followed by firing. In this embodiment, the shape of the window 6 of the zirconia substrate 2, that is, in other words, the shape of the diaphragm section 10 is rectangular (quadrangular). However, there is no limitation thereto. The shape may be, for example, circular, polygonal, and elliptical depending on the use or application of the piezoelectric and/or electrostrictive film-type element. A combination of these shapes as well as arbitrary shapes may be used. Further, an arbitrary number of the diaphragm sections 10 in an arbitrary arrangement may be appropriately selected.

The objective piezoelectric and/or electrostrictive operating section 18 is formed on the diaphragm section 10 by using the fired zirconia substrate 2 thus prepared. For this purpose, at first, the lower electrode 12 is formed on the outer surface of the diaphragm section 10 by using a predetermined electrode material in the same manner as hitherto performed in accordance with various known film-forming techniques. Specifically, the electrode material for producing the lower electrode 12 is not especially limited provided that it is a conductor which can endure an oxidizing atmosphere at a high temperature. For example, the electrode material may be a simple substance of metal or an alloy. No problem occurs at all when the electrode material is a mixture of an insulative ceramic of bismuth oxide, zinc oxide, titanium oxide or the like and a simple substance of metal or an alloy thereof, or when the electrode material is a conductive ceramic. However, those more preferably used include, for example, electrode materials containing a major component of noble metal having a high melting point such as platinum, palladium, and rhodium, or an alloy such as silver-palladium, silver-platinum, and platinum-palladium, and cermet materials comprising platinum and a zirconia substrate-constructing material and/or a piezoelectric material and/or an electrostrictive material component. Among them, more preferably, it is desirable to use only platinum, or a material containing a major component of an alloy of platinum. The zirconia substrate-constructing material is preferably added to the electrode material in a ratio of about 5 to 30% by volume. The piezoelectric and/or electrostrictive material or the constituting component thereof is preferably added in a ratio of about 5 to 20% by volume.

The lower electrode 12 is formed by using the conductive material as described above in accordance with a thick film-forming technique such as screen printing, spray, coating, dipping, and application, or a thin film-forming technique such as sputtering, ion beam, vacuum deposition, ion plating, CVD, and plating. Among them, the thick film-forming technique is preferably adopted. The lower electrode 12 formed in accordance with such a thick film-forming technique is subjected to sintering for the electrode itself, and generally to a heat treatment (firing) in the same manner as hitherto performed, in order to make integral junction to the diaphragm section 10. The thickness of the lower electrode 12 after the firing is generally not more than 20 $\mu$m, preferably not more than 5 $\mu$m.

Next, the piezoelectric and/or electrostrictive layer 14 is formed on the lower electrode 12 thus formed, by using a predetermined piezoelectric and/or electrostrictive material in accordance with various known film-forming methods. In this procedure, the piezoelectric and/or electrostrictive layer 14 is formed in a planar form larger than that of the lower electrode 12 (see FIGS. 1 and 2) so that at least parts of the peripheral edge portions of the piezoelectric and/or electrostrictive layer 14 extend laterally beyond the corresponding peripheral edge portions of the lower electrode 12 to construct the overhang sections 14a located opposingly over the partial regions of the diaphragm section 10. Those preferably adopted for the formation of the piezoelectric and/or electrostrictive layer 14 as described above include the thick film-forming techniques described above, specifically the film-forming techniques based on, for example, screen printing, spray, coating, dipping, and application. The use of the thick film-forming technique makes it possible to form a film of the piezoelectric and/or electrostrictive layer 14 on the outer surface of the diaphragm section 10 of the zirconia substrate 2 by using a paste or a slurry containing a major component of piezoelectric and/or electrostrictive ceramic particles having an average particle diameter of about 0.01 $\mu$m to 7 $\mu$m, preferably about 0.05 $\mu$m to 5 $\mu$m. Thus good element characteristics are obtained. Among the thick film-forming methods, the screen printing method is especially preferably used, since fine patterning can be formed inexpensively. In order to obtain, for example, a large displacement with a low operating voltage, it is desirable that the thickness of the formed piezoelectric and/or electrostrictive layer 14 after the firing is preferably not more than 50 $\mu$m, more preferably not less than 3 $\mu$m and not more than 40 $\mu$m.

In the method A according to the present invention as described above, those containing magnesia or a component to give magnesia independently or in a form of a compound are used as a piezoelectric and/or electrostrictive material for forming the piezoelectric and/or electrostrictive layer 14. The component to give magnesia referred to herein means a component such as a simple substance of magnesium which is converted into magnesia, for example, in the following firing step. The piezoelectric and/or electrostrictive material containing magnesia or the component to give magnesia specifically includes a material containing a major component of lead zirconate titanate (PZT system), a material containing a major component of lead nickel niobate (PNN system), a material containing a major component of lead manganese niobate, a material containing a major component of lead antimony stannate, a material containing a major component of lead zinc niobate, a material containing a major component of lead titanate, a material containing a major component of lead nickel tantalate, and a material obtained by adding, for example, to a composite material of the foregoing or the like, magnesia or magnesium, in other words, obtained by addition to be contained independently from the component of the piezoelectric and/or electrostrictive composition. However, in the present invention, those containing magnesia in a form of a compound are advantageously used for the piezoelectric and/or electrostrictive composition exhibiting the piezoelectric and/or electrostrictive characteristics. Those preferably used include, for example, a material containing a major component of lead magnesium niobate (PMN system), a material containing a major component of lead magnesium tantalate, and a composite material composed of such a material and a material of the PZT system described above.

Among the piezoelectric and/or electrostrictive materials as described above, those advantageously used include a material containing a major component comprising lead magnesium niobate, lead zirconate, and lead titanate, a material containing a major component comprising lead nickel niobate, lead magnesium niobate, lead zirconate, and lead titanate, a material containing a major component comprising lead magnesium niobate, lead nickel tantalate, lead zirconate, and lead titanate, and a material containing a major component comprising lead magnesium tantalate, lead magnesium niobate, lead zirconate, and lead titanate. Those preferably used also include materials containing, in the foregoing material, additives of oxides or other types of compounds of, for example, lanthanum, barium, niobium, magnesium, zinc, cerium, cadmium, chromium, cobalt, antimony, iron, yttrium, tantalum, tungsten, nickel, manganese, lithium, strontium, and bismuth.

In the case of such a multicomponent piezoelectric and/or electrostrictive material, the piezoelectric and/or electrostrictive characteristics may change depending on the composition of components. However, a composition in the vicinity of the boundary among phases of pseudo-cubic crystal-tetragonal crystal-rhombohedral crystal is preferred in the case of the three-component material such as lead magnesium niobate-lead zirconate-lead titanate, and the four-component material such as lead magnesium niobate-lead nickel tantalate-lead zirconate-lead titanate and lead magnesium tantalate-lead magnesium niobate-lead zirconate-lead titanate which are preferably adopted in the present invention. Especially, those advantageously adopted include a composition comprising 15 to 50 molar % of lead magnesium niobate, 10 to 45 molar % of lead zirconate, and 30 to 45 molar % of lead titanate, a composition comprising 15 to 50 molar % of lead magnesium niobate, 10 to 40 molar % of lead nickel tantalate, 10 to 45 molar % of lead zirconate, and 30 to 45 molar % of lead titanate, and a composition comprising 15 to 50 molar % of lead magnesium niobate, 10 to 40 molar % of lead magnesium tantalate, 10 to 45 molar % of lead zirconate, and 30 to 45 molar % of lead titanate, because they have high piezoelectric constants and excellent electromechanical coupling coefficients.

As for the content of magnesia or the component to give magnesia in the piezoelectric and/or electrostrictive material, when it is contained in a form of a compound to constitute a component of a piezoelectric and/or electrostrictive composition, it is used as it is in such a piezoelectric and/or electrostrictive composition. When magnesia or the component to give magnesia is contained in an independent form, the content is appropriately determined depending on an amount of alumina contained in the diaphragm section 10 in a ratio sufficient to react therewith to produce the compound, in a degree not to badly affect the piezoelectric and/or electrostrictive characteristics of the piezoelectric and/or electrostrictive layer 14 to be formed.

The piezoelectric and/or electrostrictive layer 14 formed on the lower electrode 12 as described above is subjected to a predetermined heat treatment (firing) operation to produce an integral layered structure, thereby achieving integral junction on the diaphragm section 10. As for the temperature during the heat treatment (firing) in this procedure, a temperature of about 500° C. to 1400° C. is generally adopted. Preferably, a temperature in an range of 1000° C. to 1400° C. is advantageously selected. When the film-shaped piezoelectric and/or electrostrictive layer 14 is treated with heat (fired), it is preferred to perform the heat treatment (firing) together with an evaporation source of the piezoelectric and/or electrostrictive material while controlling the atmosphere, in order not to render the composition of the piezoelectric and/or electrostrictive layer unstable at a high temperature. Alternatively, it is recommended to adopt a technique of firing in which an appropriate covering member is placed on the piezoelectric and/or electrostrictive layer 14 to prevent the surface of the piezoelectric and/or electrostrictive layer 14 from being directly exposed to the firing atmosphere. In this procedure, the covering member to be used is composed of a material similar to that of the zirconia substrate 2.

The heat treatment (firing) for the piezoelectric and/or electrostrictive layer 14 allows the piezoelectric and/or electrostrictive layer 14 to be sintered to have a dense quality and acquire the objective piezoelectric and/or electrostrictive characteristics. Further, the heat treatment (firing) operation allows the magnesia or the component to give magnesia existing in the piezoelectric and/or electrostrictive layer 14 to move toward the lower electrode 12 and toward the diaphragm section 10 of the zirconia substrate 2. On the other hand, in conformity with the movement of the magnesia or the component to give magnesia, the alumina existing at least in the diaphragm section 10 of the zirconia substrate 2 is also moved toward the lower electrode 12. The moved alumina component and the moved magnesia component react at least at the boundary between the overhang sections 14a and partial regions of the diaphragm section 10 located just thereunder to deposit junction-prohibiting particles 20 comprising a predetermined compound. The particles remain and exist at the boundary. Owing to the low reactivity of the deposited particles 20 with respect to the piezoelectric and/or electrostrictive layer 14, the incomplete connection state is established between the overhang sections 14a and the partial regions of the diaphragm section 10 located just thereunder. Thus the firm junction or fusion, which would be otherwise formed between them, is effectively prohibited.

The intervention of the junction-prohibiting particles 20 principally comprising the compound of alumina and magnesia produced by the firing operation as described above avoids the firm fusion (junction) which would be otherwise formed between the overhang sections 14a of the piezoelectric and/or electrostrictive layer 14 and the partial regions of the diaphragm section 10 located just thereunder. Accordingly, the residual stress on the piezoelectric and/or electrostrictive layer 14 is effectively reduced. Thus it is possible to advantageously avoid deterioration of the piezoelectric and/or electrostrictive characteristics. Moreover, it is possible to advantageously dissolve the problem of occurrence of the dispersion in sintering for the piezoelectric and/or electrostrictive layer 14, the dispersion in residual stress, and the dispersion in rigidity of the element which would be otherwise caused by the dispersion in the presence or absence of the fusion (junction). Thus it is possible to effectively decrease the dispersion in the piezoelectric and/or electrostrictive characteristics and the dispersion in the resonance frequency characteristics as well.

As for the zirconia substrate 2 with the diaphragm section 10 having the outwardly convex shape as preferably used in the present invention as described above, the outwardly convex shape is generally changed to the inwardly concave shape by the firing operation for the piezoelectric and/or electrostrictive layer 14.

After that, the upper electrode 16 for constructing the piezoelectric and/or electrostrictive operating section 18 is formed on the fired piezoelectric and/or electrostrictive layer 14 by using an electrode material to produce the upper electrode 16 in the same manner as the lower electrode 12 in accordance with various known film-forming methods. Especially, it is desirable to form the upper electrode 16 in accordance with a screen printing method based on the use of resinate or thick film paste, or a thin film-forming method such as sputtering, ion beam, vacuum deposition, ion plating, CVD, and plating. The firing operation is applied for the formation of the upper electrode 16, if necessary. In particular, when the upper electrode 16 is formed, the piezoelectric and/or electrostrictive layer 14 is provided to cover the lower electrode 12 owing to the existence of the overhang sections 14a. Accordingly, the upper electrode 16 can be easily formed on the piezoelectric and/or electrostrictive layer 14 without considering the problem of short circuit formation with the lower electrode 12 at all. This feature is more advantageously exhibited when a large number of the piezoelectric and/or electrostrictive operating sections 18 are arranged in a narrow area. The thickness of the upper electrode 16 (the thickness after the firing, when the firing is performed) is generally not more than 20 μm, preferably not more than 5 μm. The entire thickness of the piezoelectric and/or electrostrictive operating section 18 to be adopted (after the firing), which is obtained by adding the thickness of the upper electrode 16 to the thickness of the piezoelectric and/or electrostrictive layer 14 and the thickness of the lower electrode 12, is generally not more than 100 μm, preferably not more than 50 μm.

Figure 3:
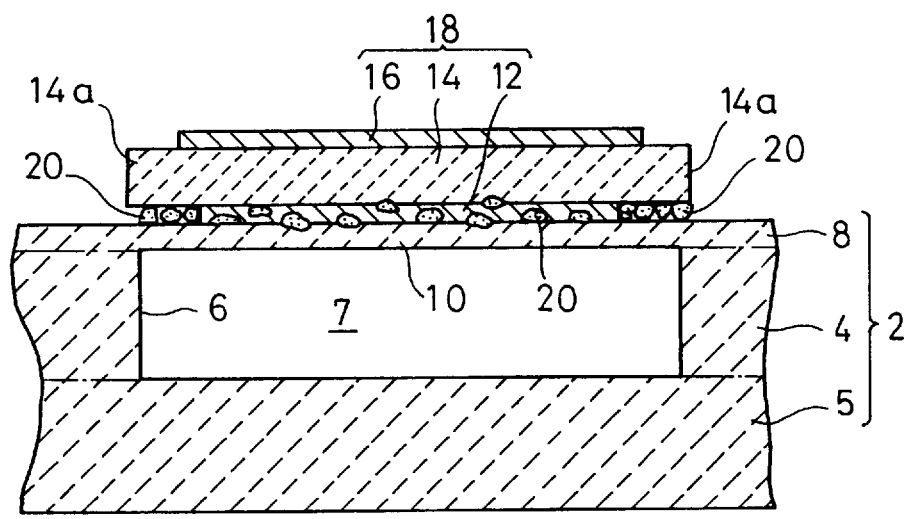
FIG. 3 shows a partial cross-sectional view illustrating an example of a piezoelectric and/or electrostrictive film-type element according to the present invention.

FIG. 3 shows a cross-sectional view concerning an example of the piezoelectric and/or electrostrictive film-type element produced in accordance with the method A described above. In this embodiment, the deposited junction-prohibiting particles 20 composed of the alumina-magnesia compound, which principally comprise the compound formed by the reaction of alumina and magnesia, exist and distribute principally over the entire vicinity of the diaphragm section 10, the lower electrode 12, and the overhang sections 14a. Owing to the small reactivity of the deposited particles 20 with respect to the piezoelectric and/or electrostrictive layer 14, the firm conglutination or coalescence is prohibited, which would be otherwise formed between the overhang sections 14a of the piezoelectric and/or electrostrictive layer 14 and the partial regions of the diaphragm section 10 located just thereunder. Thus the incomplete connection state is established therebetween. In FIG. 3, a lower opening of the window 6 of the base plate 4 is covered and closed by a covering plate 5 to form an internal hollow space 7. Therefore, in this embodiment, the zirconia substrate 2 is formed integrally by the base plate 4, the covering plate 5, and the diaphragm plate 8.

The method B described above, which is one of the techniques for producing the piezoelectric and/or electrostrictive film-type element according to the present invention, is different from the foregoing method A in that alumina is not allowed to exist at least in the diaphragm section 10 of the zirconia substrate 2. The method B is specifically characterized in that alumina is allowed to exist in the lower electrode 12. In order to form the lower electrode 12 containing alumina, the lower electrode 12 may be formed on the outer surface of the diaphragm section 10 of the zirconia substrate 2 by using an electrode material containing alumina or a component to give alumina, in accordance with a film-forming method similar to that described above. Also in this embodiment, the firing operation is applied to the lower electrode 12, if necessary. Accordingly, the alumina, which is allowed to exist in the lower electrode 12, moves to the boundary between the overhang sections 14a and the partial regions of the diaphragm section 10 located opposingly just thereunder, together with the magnesia component contained in the piezoelectric and/or electrostrictive layer 14, upon the firing for the piezoelectric and/or electrostrictive layer 14. Thus the junction-prohibiting particles 20 are deposited, which principally comprise the compound formed by the reaction of alumina and magnesia. The deposited particles 20 effectively avoid the junction which would be otherwise formed between the overhang sections 14a and the partial regions of the diaphragm section 10 opposed thereto. The method B is advantageously adopted when the overhang sections 14a have a relatively short length because of limitation of the movement of alumina from the lower electrode 12.

In this embodiment, those used as the electrode material to produce the lower electrode 12 contain the conductive material as described above, as well as alumina or the component to give alumina generally in an amount of 1 to 30% by weight, desirably 2 to 10% by weight, more desirably 4 to 10% by weight. If the content of alumina or the component to give alumina exceeds a ratio of 30% by weight, a problem arises in electrical continuity as an electrode. If the content is less than 1% by weight, the amount of the deposited alumina-magnesia compound particles 20 is decreased, and it is difficult to sufficiently enjoy the junction-prohibiting effect to be offered by the particles 20. It is noted that the component to give alumina means a component such as a simple substance of aluminum which may be converted into alumina in the following firing step or the like.

The methods C and D described above are as follows, which are the third and fourth techniques for obtaining the piezoelectric and/or electrostrictive film-type element according to the present invention. Namely, the fired zirconia substrate 2 is prepared provided that no alumina component is contained. A separation layer is formed at least around the region on which the lower electrode 12 is formed on the outer surface of the diaphragm section 10 of the zirconia substrate 2. The separation layer contains alumina or a component to give alumina; alumina or a component to give alumina and magnesia or a component to give magnesia; or particles principally comprising a compound of alumina and magnesia. Firing is performed, if necessary. The lower electrode 12 is formed on the outer surface of the diaphragm section 10 before or after the formation of the separation layer, in the same manner as the methods A and B described above. Firing is performed for the lower electrode 12, if necessary. The piezoelectric and/or electrostrictive layer 14 is formed on the lower electrode 12, and firing is performed for the piezoelectric and/or electrostrictive layer 14. Thus the particles 20 principally comprising the compound of alumina and magnesia are allowed to deposit and intervene at least at the boundary between the overhang sections 14a of the piezoelectric and/or electrostrictive layer 14 and the partial regions of the diaphragm section 10 located just thereunder so as to prohibit the junction which would be otherwise formed between the overhang sections 14a and the partial regions of the diaphragm section 10 located just thereunder.

Figure 4:
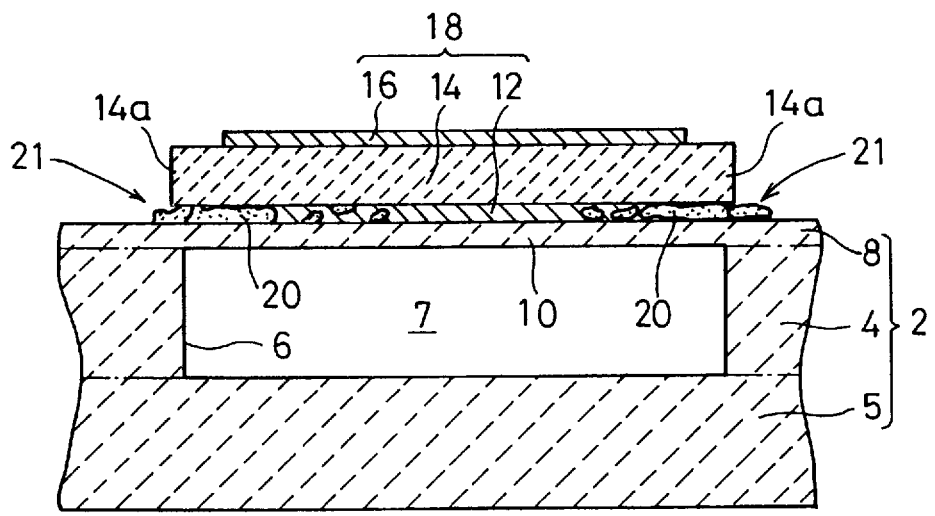
FIG. 4 explanatorily shows a partial cross-sectional view illustrating another example of a piezoelectric and/or electrostrictive film-type element according to the present invention.

When the piezoelectric and/or electrostrictive film-type element is produced in accordance with the methods C and D, for example, as shown in FIG. 4, an intervening layer 21 constructed by the particles 20 of the alumina-magnesia compound exists around the lower electrode 12, after the firing for the piezoelectric and/or electrostrictive layer 14. The intervening layer 21 is located between the overhang sections 14a of the piezoelectric and/or electrostrictive layer 14 and the partial regions of the diaphragms section 10. Accordingly, the low reactivity of the alumina-magnesia compound particles 20 for constructing the intervening layer 21 with respect to the piezoelectric and/or electrostrictive layer 14 effectively avoids the firm fusion or conglutination which would be otherwise formed between the overhang sections 14a and the partial regions of the diaphragm section 10 located just thereunder. Thus the incomplete connection state is advantageously realized therebetween.

In the case of the method C, the separation layer, which is formed around the region for forming the lower electrode 12, is composed of alumina or the component to give alumina. Therefore, the alumina component in the separation layer reacts with the magnesia component moved from the piezoelectric and/or electrostrictive layer 14, and thus the intervening layer 21 comprising the alumina-magnesia compound particles 20 is formed. In the case of the method D, the separation layer is composed of alumina or the component to give alumina and magnesia or the component to give magnesia. Therefore, the reaction of the alumina component and the magnesia component is evoked in the separation layer upon the firing for the piezoelectric and/or electrostrictive layer 14. Thus the alumina-magnesia compound particles 20 are produced, and the intervening layer 21 is formed. Alternatively, in the case of the method D, the separation layer may be composed of the particles 20 principally comprising the compound of alumina and magnesia. Therefore, the separation layer is located as the intervening layer 21 as it is, between the overhang sections 14a and the partial regions of the diaphragm section 10 to avoid the firm fusion or conglutination therebetween.

The separation layer to give the intervening layer 21 composed of the alumina-magnesia compound particles 20 is formed so that the thickness of the intervening layer 21 is generally 0.1 to 10 $\mu$m, desirably 0.2 to 5 $\mu$m. If the thickness of the intervening layer 21 exceeds 10 $\mu$m, the rigidity of the diaphragm section 10 becomes large, and a new problem arises in that sintering for the piezoelectric and/or electrostrictive layer 14 is inhibited. If the thickness is thinner than 0.1 $\mu$m, a problem arises in that the intervening effect is not sufficient. It is not limited that the separation layer is formed only partially around the diaphragm section 10 on which the lower electrode 12 is formed. There is no problem at all when the separation layer is formed over the entire surface of the diaphragm section 10 on which the lower electrode 12 is formed.

The piezoelectric and/or electrostrictive film-type element thus obtained according to the present invention has the following features. Namely, the firm fusion or conglutination is avoided, which would be otherwise formed between the overhang sections 14a of the piezoelectric and/or electrostrictive layer 14 and the partial regions of the diaphragm section 10, where the lower electrode 12 is not present. Thus the incomplete connection state is established therebetween. Accordingly, it is possible to advantageously exhibit the original piezoelectric and/or electrostrictive characteristics of the piezoelectric and/or electrostrictive operating section 18. Moreover, the residual stress of the piezoelectric and/or electrostrictive layer 14 is also reduced. Accordingly, the displacement characteristics are improved, and the dispersion thereof is also effectively reduced. Therefore, the piezoelectric and/or electrostrictive film-type element according to the present invention can be advantageously used for various applications such as transducers, sensors, and actuators.

Especially, in the piezoelectric and/or electrostrictive film-type element according to the present invention, the displacement and the force are effectively exerted owing to the action of the piezoelectric and/or electrostrictive operating section provided on the outer surface side of the diaphragm section. Accordingly, the piezoelectric and/or electrostrictive film-type element can be advantageously used as piezoelectric and/or electrostrictive actuators. The element of the present invention can be especially advantageously used, for example, as a uni-morph type or a bi-morph type actuator for generating bending displacement to be used for filters, various sensors such as ultrasonic sensors, angular velocity sensors, acceleration sensors, and shock sensors, microphones, sounding bodies (speakers and the like), discriminators, vibrators, oscillators, and resonators for power generation and communication, as well as displays, servo displacement elements as described by Kenji Makino in "Piezoelectric and/or electrostrictive actuators: from the basic to application" (edited by Japan Industrial Technology Center, published by Morikita-Syuppan), pulse driving motors, ultrasonic motors, and piezoelectric fans. The element of the present invention can be also preferably used as a thick film condenser element.

Figure 5:
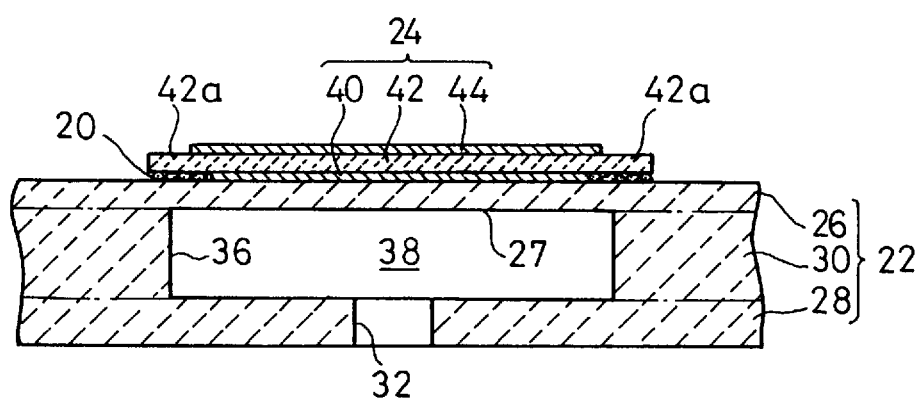
FIG. 5 explanatorily shows a cross-sectional view illustrating still another example of a piezoelectric and/or electrostrictive film-type element according to the present invention.
Figure 6:
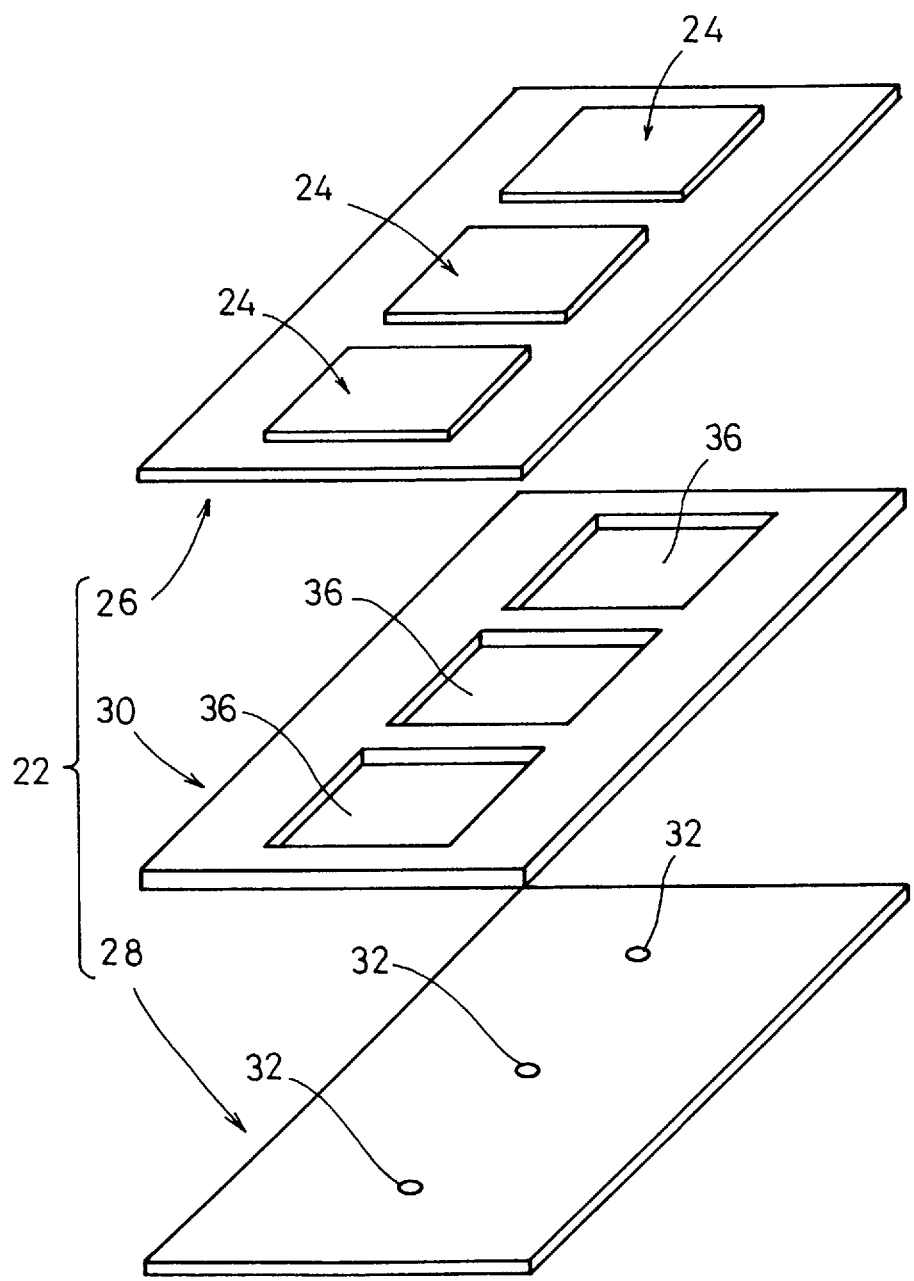
FIG. 6 shows an exploded perspective view illustrating the piezoelectric and/or electrostrictive film-type element shown in FIG. 5.

Now FIG. 5 schematically shows a more specified example of the piezoelectric and/or electrostrictive film-type element according to the present invention. FIG. 6 shows an exploded perspective view of the element shown in FIG. 5. The illustrated piezoelectric and/or electrostrictive film-type element has a structure in which a zirconia substrate 22 and a piezoelectric and/or electrostrictive operating section 24 arranged on an outer surface of its diaphragm section are combined into a single unit. The piezoelectric and/or electrostrictive operating section 24 is operated in accordance with an applied voltage so that the thin-walled diaphragm section of the zirconia substrate 22 is bent and deformed.

More specifically, the zirconia substrate 22 is integrally formed to have a structure in which a thin-walled closing plate having a flat plate shape (diaphragm plate) 26 and a connecting plate (base plate) 28 composed of predetermined zirconia materials respectively are superimposed with each other with a spacer plate (base plate) 30 also comprising a predetermined zirconia material interposed therebetween. A communicating opening 32 is formed through the connecting plate 28. The number, shape, size, and position of the communicating opening or openings 32 are appropriately selected depending on the application of the piezoelectric and/or electrostrictive film-type element. A plurality of (three in this embodiment) square windows 36 are formed through the spacer plate 30. The spacer plate 30 is superimposed on the connecting plate 28 so that each one of the communicating openings 32 provided through the connecting plate 28 is open for each of the windows 36. The closing plate 26 is superimposed on a surface of the spacer plate 30 opposite to the side on which the connecting plate 28 is superimposed. The openings of the windows 36 are covered and closed by the closing plate 26. Thus pressurizing chambers 38, which communicate with the outside through the communicating openings 32, are formed at the inside of the zirconia substrate 22. The zirconia substrate 22 is formed as an integrally fired substrate by using predetermined zirconia materials as described above. This embodiment exemplifies the substrate having the three-layered structure composed of the closing plate (diaphragm plate), the spacer plate (base plate), and the connecting plate (base plate). However, it is allowable to use a substrate having a four-layered structure or substrates having five-layered or more multiple layered structures.

The zirconia substrate 22 also includes film-shaped piezoelectric and/or electrostrictive operating sections 24 which are provided at regions corresponding to each of the pressurizing chambers 38 respectively on the outer surface of the closing plate 26. The piezoelectric and/or electrostrictive operating section 24 is constructed by successively forming a lower electrode 40, a piezoelectric and/or electrostrictive layer 42, and an upper electrode 44 in accordance with the film-forming method at a region of the closing plate 26 corresponding to each of the windows 36 of the zirconia substrate 22, i.e., on the outer surface of the diaphragm section. Therefore, when the piezoelectric and/or electrostrictive film-type element is operated, the inside of the pressurizing chamber 38 is pressurized on the basis of the operation of the piezoelectric and/or electrostrictive operating section 24. Thus discharge of a fluid contained in the pressurizing chamber 38 can be effectively realized. The piezoelectric and/or electrostrictive film-type element having this structure can be used not only as an actuator but also as a sensor for outputting bending displacement on the diaphragm section as a voltage signal. In the following explanation, the region of the closing plate 26 corresponding to the window 36 is referred to as the diaphragm section 27.

In the piezoelectric and/or electrostrictive film-type element having the structure as described above, at least parts of peripheral edge portions of the piezoelectric and/or electrostrictive layer 42 extend laterally beyond corresponding peripheral edge portions of the lower electrode 40 to form overhang sections 42a located opposingly over partial regions of the diaphragm section 27 in the same manner as described above. The junction-prohibiting particles 20 principally comprising the compound of alumina and magnesia are allowed to intervene between the overhang sections 42a and the partial regions of the diaphragm section 27 located just thereunder. Thus the incomplete connection state is established therebetween.

The piezoelectric and/or electrostrictive film-type element as the objective of the present invention may be used as an actuator, a sensor, and a transducer advantageously for constituting components of speakers, displays, servo displacement elements, pulse driving motors, ultrasonic motors, acceleration sensors, shock sensors, vibrators, oscillators, and resonators as described above. Of course, it is needless to say that the piezoelectric and/or electrostrictive film-type element of the present invention may be advantageously used for other various known applications.

EXAMPLES

Representative Examples of the present invention will be described below in order to clarify the present invention more specifically. However, it is needless to say that the present invention is not limited at all by the description of Examples. It should be understood that the present invention may be variously altered, corrected, or modified on the basis of the knowledge of those skilled in the art without deviating from the spirit or essential characteristics of the present invention in some ways other than the following Examples as well as other than the foregoing embodiments.

Example 1

In order to produce piezoelectric and/or electrostrictive film-type elements as shown in FIGS. 5 and 6, fired zirconia substrates 22 were prepared, with their diaphragm sections 27 (closing plates 26) having different alumina contents as shown in Table 1 described later on, in each of which 10 rectangular windows 36 each having a size of 0.3 mm×0.5 mm were arranged in a longitudinal direction of the substrate and aligned along a direction parallel to their sides of 0.3 mm while leaving each spacing distance of 0.2 mm therebetween. A lower electrode 40, a piezoelectric and/or electrostrictive layer 42, and an upper electrode 44 were successively stacked and formed in predetermined sizes respectively as described below, on an outer surface of the diaphragm section 27 of the zirconia substrate 22. The respective layers were formed such that the lower electrode 40 had a transverse width of 0.24 mm, the piezoelectric and/or electrostrictive layer 42 had a transverse width of 0.32 mm, and the upper electrode 44 had a transverse width of 0.26 mm, as represented by the sizes of the element (after firing) shown in FIG. 5. Communicating openings 32 of 0.2 mm φ were formed through the connecting plate 28 for constructing the zirconia substrate 22 so that each of the communicating openings 32 was located on the center of the window 36 having a transverse width of 0.30 mm.

The element was produced such that a connecting plate 28 and a spacer plate 30 for constructing a base section (base plate) of the zirconia substrate 22 had a thickness of 150 $\mu$m after firing respectively, while a closing plate 26 to give the diaphragm section had a thickness of 14 $\mu$m after firing. The connecting plate 28, the spacer plate 30, and the closing plate 26 were produced from a material based on the use of zirconia partially stabilized with 3 molar % of yttria. The closing plate 26 was superimposed on the connecting plate 28 and the spacer plate 30 to obtain the zirconia substrate 22 combined into a single unit. For this purpose, green sheets for the respective plates were produced as follows, and they were stacked and glued under a pressure, followed by firing.

(a) Preparation of Green Sheet for Closing Plate 26

Zirconia powder partially stabilized with 3 molar % yttria (average particle diameter: 0.4 $\mu$m): (100−x) parts by weight Alumina powder (average particle diameter: 0.2 $\mu$m): x parts by weight Polyvinyl butyral resin (binder): 9.0 parts by weight Dioctylphthalate (plasticizer): 4.5 parts by weight Dispersing agent comprising sorbitan fatty acid ester: 2.0 parts by weight Mixed solvent of toluene/isopropyl alcohol (50/50): 70 parts by weight This composition was mixed in a pot mill by using zirconia cobblestone to obtain a slurry having an initial viscosity of 1200 cps (centipoise). Next, this slurry was deaerated under vacuum, and its viscosity was adjusted to be 2000 cps. After that, a reverse roll coater apparatus was used to form a green sheet so that a diaphragm section having a thickness of 8 $\mu$m or 14 $\mu$m after firing was given. Drying was performed at 50° C. for 10 minutes.

(b) Preparation of Green Sheets for Connecting Plate 28 and Spacer Plate 30

Zirconia powder partially stabilized with 3 molar % yttria (average particle diameter: 0.4 $\mu$m): 100 parts by weight Polyvinyl butyral resin (binder): 8.0 parts by weight Dioctylphthalate (plasticizer): 4.0 parts by weight Dispersing agent comprising sorbitan fatty acid ester: 1.0 part by weight Mixed solvent of xylene/normal butyl alcohol (50/50): 63 parts by weight This composition was mixed in a pot mill by using zirconia cobblestone to obtain a slurry having an initial viscosity of 2000 cps. Next, this slurry was deaerated under vacuum, and its viscosity was adjusted to be 5000 cps. After that, a doctor blade apparatus was used to form a green sheet so that a thickness after firing was 150 $\mu$m. Drying was performed at 80° C. for 2 hours.

The green sheets for the connecting plate and the spacer plate obtained as described above were subjected to pattern punching (formation of the communicating opening 32 and the windows 36) by using predetermined molds respectively. After that, the green sheet for the closing plate prepared as described above was superimposed on them, followed by thermal adhesion under a condition of 80° C. for 1 minute at a pressure of 100 kg/cm². A combined single stacked unit thus obtained was fired for 2 hours at a temperature of 1500° C. to obtain various zirconia substrates 22 with their diaphragm sections 27 having variously different alumina contents.

Next, a platinum paste was printed in accordance with the screen printing method at a predetermined position on the outer surface of the diaphragm section 27 by using the obtained various zirconia substrates 22 so that a thickness after firing was 3 μm. Drying was performed at 120° C. for 10 minutes, followed by firing at 1350° C. for 2 hours to form the lower electrode 40.

After that, a paste for forming the piezoelectric and/or electrostrictive layer was printed in accordance with the screen printing method on the lower electrode 40 so that a thickness after firing was 30 μm. Drying was performed at 120° C. for 20 minutes, followed by firing at 1275° C. for 2 hours to form the piezoelectric and/or electrostrictive layer 42. The formation of the piezoelectric and/or electrostrictive layer 42 provided overhang sections 42a formed to have a length of about 0.04 mm in the transverse direction in FIG. 5. Powder (average particle diameter: 0.9 μm) of a material comprising 38 molar % of lead magnesium niobate, 24 molar % of lead zirconate, and 38 molar % of lead titanate (a part of Pb was substituted with Sr and La) was used as the piezoelectric and/or electrostrictive material. A composition comprising 100 parts by weight of the powder, 3 parts by weight of an acrylic binder, and 20 parts by weight of terpineol (solvent) was mixed and kneaded to produce a paste having a viscosity of 100000 cps. Thus the paste for forming the piezoelectric and/or electrostrictive layer was prepared. Upon firing for the piezoelectric and/or electrostrictive layer 42, the piezoelectric and/or electrostrictive material powder, which was used for preparing the paste for forming the piezoelectric and/or electrostrictive layer, was allowed to exist in a firing furnace so that the firing atmosphere was controlled.

After the firing operation for the piezoelectric and/or electrostrictive layer 42 was completed, a thin film of Cr was formed on the piezoelectric and/or electrostrictive layer 42 in accordance with the sputtering method, on which a film of Cu was formed to construct the upper electrode 44. Thus the objective various piezoelectric and/or electrostrictive film-type elements were obtained. A voltage of 40 V was applied for 10 minutes in a forward direction with respect to the displacement direction between the upper electrode 44 and the lower electrode 40 of each of the piezoelectric and/or electrostrictive operating sections 24 of the obtained piezoelectric and/or electrostrictive film-type elements so that the polarization treatment was applied respectively.

The average displacement amount (driven by an applied voltage of 30 V), the dispersion in displacement, and the incomplete connection state between the overhang sections 42a of the piezoelectric and/or electrostrictive layer 42 and the partial regions of the diaphragm section 27 located opposingly just thereunder on which the lower electrode 40 was not present were investigated for the various piezoelectric and/or electrostrictive film-type elements thus obtained (n=5, the number of the piezoelectric and/or electrostrictive operating sections 24=50) respectively. Results are shown in Table 1 described later on.

The incomplete connection state was evaluated as follows by measuring the peel strength of the piezoelectric and/or electrostrictive layer 42. At first, a platinum paste for a lower electrode was printed by means of the screen printing on a ceramic substrate (thickness: 300 μm) having the same composition as that of the closing plate 26, and drying was performed at 120° C. for 10 minutes, followed by firing at 1350° C. for 2 hours to obtain a ceramic substrate provided with an electrode film in which the platinum electrode film had a thickness of 3 μm and the electrode pattern had a size of 5 mm×5 mm. Next, the actually used piezoelectric and/or electrostrictive layer 42 was formed on the ceramic substrate provided with the electrode film so that the electrode film was located on the center, and the pattern after firing had a size of 10 mm×10 mm and a thickness of 30 μm, followed by firing under the same condition as that used for the piezoelectric and/or electrostrictive film-type element. Thus a sample for evaluation was obtained, in which peripheral edge portions of the piezoelectric and/or electrostrictive layer were overhang sections. After that, in order to measure the peel strength of the sample for evaluation between the ceramic substrate and the overhang section of the piezoelectric and/or electrostrictive layer under which no electrode film existed, the overhang section was cut together with the ceramic substrate by means of laser processing into a size of 2 mm×2 mm. The peel strength was measured for an obtained piece of the overhang section. Namely, an L-type lead wire for measuring the peel strength having a thickness of 0.8 mm φ was glued with an adhesive to the surface of the piezoelectric and/or electrostrictive film of 2 mm×2 mm. The lead wire was stretched at a velocity of 20 mm/min by using a tensile tester. The peel strength was obtained by calculating a value per 1 $mm^2$ at which the piezoelectric and/or electrostrictive layer was peeled off.

TABLE 1

| No. | Alumina content (x % by weight) | Thickness of diaphragm section (μm) | Average displacement amount (μm) | Dispersion in displacement ($\sigma_{n-1}$: μm) | Peel strength (kg/$mm^2$) |
|---|---|---|---|---|---|
| 1 | 1.5 | 14 | 0.22 | 0.01 | <0.01 |
| 2 | 2.5 | 14 | 0.22 | 0.01 | <0.01 |
| *3 | 0.0 | 14 | 0.12 | 0.03 | 0.35 |

*: Comparative Example

According to the results shown in Table 1, the following facts were clarified. Namely, the piezoelectric and/or electrostrictive film-type elements of Nos. 1 and 2, in which the predetermined amount of alumina was contained in the diaphragm section 27 of the zirconia substrate 22, contained magnesia in the form of the compound in the piezoelectric and/or electrostrictive material for forming the piezoelectric and/or electrostrictive layer 42. Accordingly, the magnesia component moved during the firing for the piezoelectric and/or electrostrictive layer 42, and it reacted with the alumina component existing in the diaphragm section 27 at the boundary between the overhang sections 42a and the partial regions of the diaphragm section 27 located just thereunder to produce and deposit the particles 20 principally comprising the compound of alumina and magnesia, the compound having been confirmed to be spinel. Thus the form of deposition of the particles as shown in FIG. 3 was presented. Accordingly, the firm fusion or conglutination, which would be otherwise formed therebetween, was effectively avoided, and thus the excellent displacement characteristics were realized.

On the contrary, when no alumina was present in the diaphragm section 27 of the zirconia substrate 22 for constructing the piezoelectric and/or electrostrictive film-type element (No. 3), no particle of the compound of magnesia and alumina, such as spinel was deposited at the boundary between the overhang sections 42a of the piezoelectric and/or electrostrictive layer 42 and the partial regions of the diaphragm section 27 located just thereunder. Accordingly, the boundary was conglutinated. Therefore, it was observed that the amount of displacement of the element was small, and the dispersion in displacement was large.

Example 2

The green sheets for the connecting plate 28 and the spacer plate 30 were used together with the green sheet for the closing plate 26 containing no alumina powder (x % by weight=0) as described in Example 1 to prepare a fired zirconia substrate 22 having 10 rectangular windows 36 arranged in the longitudinal direction in the same manner as Example 1.

Next, a predetermined separation layer was printed by means of the screen printing and formed to have a width of 0.10 mm by means of subsequent firing (1450° C. for 2 hours) on partial regions of the diaphragm section 27 by using a paste preparation of alumina powder or a paste preparation of spinel powder so that the separation layer could be overlapped with peripheral edge portions of the lower electrode 40 around a region on which the lower electrode 40 was formed on the outer surfaces of the partial regions of the diaphragm section 27 of the fired zirconia substrate 22 obtained as described above. As for the thickness of the separation layer, it had a thickness of 2 μm after the firing.

After that, a lower electrode 40, a piezoelectric and/or electrostrictive layer 42, and an upper electrode 44 were successively formed on the diaphragm section 27 corresponding to the each of the windows 36 of the zirconia substrate 22 thus obtained in the same manner as Example 1 to prepare a piezoelectric and/or electrostrictive film-type element in which 10 piezoelectric and/or electrostrictive operating sections 24 were arranged.

The two kinds of the piezoelectric and/or electrostrictive film-type elements (Nos. 4 and 5) were thus obtained, for which the amount of displacement (average) and the dispersion in displacement were investigated in the same manner as Example 1, and the incomplete connection state between the overhang sections 42a of the piezoelectric and/or electrostrictive layer 42 and the partial regions of the diaphragm section 27 located just thereunder was also investigated on the basis of the peel strength in the same manner as Example 1. Results are shown in the following Table 2. However, samples for evaluation to measure the peel strength in Example 2 were prepared as follows. Namely, a separation layer composed of alumina or spinel (2 mm thickness) similar to that of the foregoing element was allowed to intervene between the ceramic substrate and the overhang sections of the piezoelectric and/or electrostrictive layer, and the piezoelectric and/or electrostrictive layer was fired.

TABLE 2

| No. | Material for separation layer | Thickness of diaphragm section (μm) | Amount displacement amount (μm) | Dispersion in displacement ($\sigma_{n-1}$: μm) | Peel strength (kg/mm²) |
|---|---|---|---|---|---|
| 4 | alumina powder | 14 | 0.17 | 0.01 | 0.020 |
| 5 | spinel powder | 14 | 0.16 | 0.01 | 0.025 |

According to the results shown in Table 2, the following facts were clarified. Namely, the separation layer comprising the alumina powder or the spinel powder was allowed to intervene between the overhang sections 42a and the partial regions of the diaphragm section 27 to fire the piezoelectric and/or electrostrictive layer 42. Thus the firm conglutination, which would be otherwise formed therebetween, was effectively avoided. Therefore, the element was realized, in which the displacement amount was large and the dispersion in displacement is less. The separation layer comprising the spinel powder of course provided the intervening layer 21 comprising spinel particles 20 as shown in FIG. 4 after the firing for the piezoelectric and/or electrostrictive layer 42. It was also confirmed for the separation layer comprising the alumina powder that the alumina component reacted with the magnesia component moved from the piezoelectric and/or electrostrictive layer 42 during the firing for the piezoelectric and/or electrostrictive layer 42 to produce the compound such as spinel which was deposited to form the intervening layer 21 comprising compound particles 20 such as spinel particles.

As clarified from the foregoing description, in the piezoelectric and/or electrostrictive film-type element according to the present invention, the incomplete connection state is established between the overhang sections of the piezoelectric and/or electrostrictive layer of the piezoelectric and/or electrostrictive operating section and the partial regions of the diaphragm section on which the lower electrode does not exists, owing to the intervention of the particles principally comprising the compound of alumina and magnesia. Thus no restriction occurs, which would otherwise arise due to conglutination or fusion therebetween. Therefore, it is possible to effectively improve the operating characteristics or the displacement characteristics of the piezoelectric and/or electrostrictive operating section.

According to the method for producing the piezoelectric and/or electrostrictive film-type element in accordance with the present invention, the particles principally comprising the compound of alumina and magnesia are allowed to deposit or intervene at the boundary between the overhang sections and the partial regions of the diaphragm section located just thereunder during the firing for the piezoelectric and/or electrostrictive layer. Accordingly, owing to the low reactivity of the compound particles with respect to the piezoelectric and/or electrostrictive layer, it is possible to effectively avoid the firm fusion or junction which would be otherwise formed between the overhang sections and the partial regions of the diaphragm section. Thus the physical properties are prevented from deterioration which would be otherwise caused due to large residual stress on the piezoelectric and/or electrostrictive layer as a result of occurrence of such junction. Moreover, it is possible to dissolve the problem of occurrence of dispersion in sintering for the piezoelectric and/or electrostrictive layer caused by dispersion in the presence or absence of junction, dispersion in the residual stress, and dispersion in rigidity of the element. Further, it is possible to effectively suppress dispersion in the piezoelectric and/or electrostrictive characteristics such as the displacement amount and dispersion in the resonance frequency characteristics.

What is claimed is:

1. A piezoelectric and/or electrostrictive film-type element having at least one hollow space and comprising a zirconia substrate with a thin-walled diaphragm section provided integrally to cover and close said hollow space, and a film-shaped piezoelectric and/or electrostrictive operating section composed of a lower electrode, a piezoelectric and/or electrostrictive layer, and an upper electrode which are successively provided in a layered configuration on an outer surface of said diaphragm section in accordance with a film-forming method, wherein:

at least a part of a peripheral edge portion of said piezoelectric and/or electrostrictive layer extends laterally beyond a corresponding peripheral edge portion of said lower electrode to construct an overhang section located opposingly over said diaphragm section, and said overhang section is in an incomplete connection state with respect to a partial region of said diaphragm section located just thereunder by the aid of particles principally comprising a compound of alumina and magnesia allowed to intervene between said overhang section and said partial region of said diaphragm section located just thereunder.

2. The piezoelectric and/or electrostrictive film-type element according to claim 1, wherein said diaphragm section has a thickness of not less than 1 μm and not more than 50 μm.

3. The piezoelectric and/or electrostrictive film-type element according to claim 1, wherein said lower electrode has a thickness of not more than 20 μm.

4. The piezoelectric and/or electrostrictive film-type element according to claim 1, wherein said piezoelectric and/or electrostrictive layer has a thickness of not less than 3 μm and not more than 50 μm.

5. The piezoelectric and/or electrostrictive film-type element according to claim 1, wherein said upper electrode has a thickness of not more than 20 μm.

6. The piezoelectric and/or electrostrictive film-type element according to claim 1, wherein said piezoelectric and/or electrostrictive operating section has an entire thickness of not more than 100 μm.

* * * * *